US00RE41561E

(19) United States
(12) Reissued Patent
Bal

(10) Patent Number: US RE41,561 E
(45) Date of Reissued Patent: Aug. 24, 2010

(54) METHOD FOR SHARING CONFIGURATION DATA FOR HIGH LOGIC DENSITY ON CHIP

(76) Inventor: Ankur Bal, KF-56 Kavi Nagar, Ghaziabad 201002, Uttar Pardesh (IN)

(21) Appl. No.: 12/110,205

(22) Filed: Apr. 25, 2008

Related U.S. Patent Documents

Reissue of:
(64) Patent No.: 7,038,489
Issued: May 2, 2006
Appl. No.: 10/172,355
Filed: Jun. 14, 2002

(30) Foreign Application Priority Data

Jun. 15, 2001 (IN) ..... 668/DEL/2001

(51) Int. Cl.
*H01L 25/00* (2006.01)

(52) U.S. Cl. ..... 326/41; 326/37; 326/38; 326/39; 326/40; 326/46

(58) Field of Classification Search ..... 326/37–41, 326/46
See application file for complete search history.

(56) References Cited

U.S. PATENT DOCUMENTS

| | | | |
|---|---|---|---|
| 5,352,940 | A | 10/1994 | Watson |
| 5,889,413 | A | 3/1999 | Bauer |
| 6,181,164 | B1 | 1/2001 | Miller |
| 6,388,466 | B1 | 5/2002 | Wittig et al. |
| 6,523,146 | B1 | 2/2003 | Ishikawa |

*Primary Examiner*—Khai M Nguyen

(57) ABSTRACT

A system for reducing the number of programmable architecture elements in a look-up table required for implementing Boolean functions or operations that are identical or logically equivalent is provided. The system may include a single set of storage elements connected to the inputs of multiple decoders, and the storage elements may be concurrently accessed by the decoders to provide simultaneous multiple outputs thereto.

54 Claims, 4 Drawing Sheets

METHOD FOR SHARING CONFIGURATION DATA FOR HIGH LOGIC DENSITY ON CHIP

Matter enclosed in heavy brackets [ ] appears in the original patent but forms no part of this reissue specification; matter printed in italics indicates the additions made by reissue.

FIELD OF THE INVENTION

The present invention relates to the field of electronic circuits, and, more particularly, to a system for reducing the number of programmable architecture elements in a look-up table for implementing Boolean functions or operations. In other words, the invention relates to sharing configuration data for higher logic density on a chip.

BACKGROUND OF THE INVENTION

The present invention relates to programmable logic devices, particularly field programmable gate arrays (FPGAs). Lookup tables are highly configurable combinatorial logic devices. Their programming flexibility makes them desirable for use as basic building blocks in programmable logic devices (PLDs). Referring to FIG. 1, a generic implementation of a look-up table (LUT) in accordance with the prior art is shown. Generally, a lookup table includes an array of programmable architecture elements, such as SRAM cells 2, for storing data bits which are effectively used as output signals. Each one of the data bits corresponds to a particular set of input signals 1b.

A particular data bit 1b is coupled to the look-up table output terminal 1c by decoding multiplexer circuitry 1 that is controlled by the lookup table input signals. The inputs 1b and outputs 1c of the look-up table usually connect to the routing resources of the CPLD/FPGA. In many cases, the output 1c is also coupled to a sequential element (flip-flop, latch, etc.). The inputs 1b and outputs 1c can, of course, be connected to other devices.

A generic look-up table is used to implement any function that can be bounded within the inputs and outputs of the LUT. Larger functions are broken down into smaller functions tailored to fit into the LUTs. The device routing resources connect these LUTs. Typically, in a circuit netlist mapped into LUTs, multiple LUTs are used to implement identical or similar functionality. An example of this would be an adder implementation in which the number of LUTs programmed to perform addition is directly proportional to the number of bits being added. It follows that a plurality of LUTs would be programmed with the same set of configuration bits. As will be discussed further below, numerous such scenarios exist.

SUMMARY OF THE INVENTION

An object of the invention is to provide a look-up table architecture that reduces the number of LUTs required to implement identical and/or logically equivalent functions.

The present invention therefore provides a system for reducing the number of programmable architecture elements in a look-up table that are required for implementing Boolean functions or operations that are identical or logically equivalent. More particularly, the system may include a single set of storage elements connected to inputs of multiple decoders, where the storage elements are concurrently accessed by the decoders to provide simultaneous multiple outputs.

A controlled inverter or XOR gate may also be inserted before the output of any of the decoders to increase the number of derivative functions. The controlled inverter may be either static or dynamic. Further, buffers may be introduced at the output of the storage elements of the look-up table for driving the inputs of the decoders when the number of decoders exceeds the driving capacity of the storage elements.

In addition, a programmable switch network may selectively connect the outputs of the storage elements of the look-up table to the inputs of the decoders. The connections may be made to any location in the device regardless of its distance from the storage elements of the look-up table SRAM or other suitable memory architecture may be used as the storage elements of the look-up table.

A method aspect of the invention is for reducing the number of programmable architecture elements in a look-up table that are required for implementing Boolean functions or operations which are identical or logically equivalent. The method may include connecting a single set of storage elements to the inputs of multiple decoders, and providing concurrent access to the storage elements by the decoders to generate simultaneous multiple outputs.

The method may further include performing controlled inversion of the output of any of the decoders to increase the number of derivative functions, where the controlled inversion may be either static or dynamic. The method may also include buffering the output of the storage elements of the look-up table for driving the inputs of the decoders when the number of decoders exceeds the driving capacity of the storage elements. Further, the outputs of the storage elements may be programmably connected to the inputs of the decoders.

BRIEF DESCRIPTION OF THE DRAWINGS

The invention will now be described with reference to the accompanying drawings, in which.

DETAILED DESCRIPTION OF THE PREFERRED EMBODIMENTS

Figure 1:
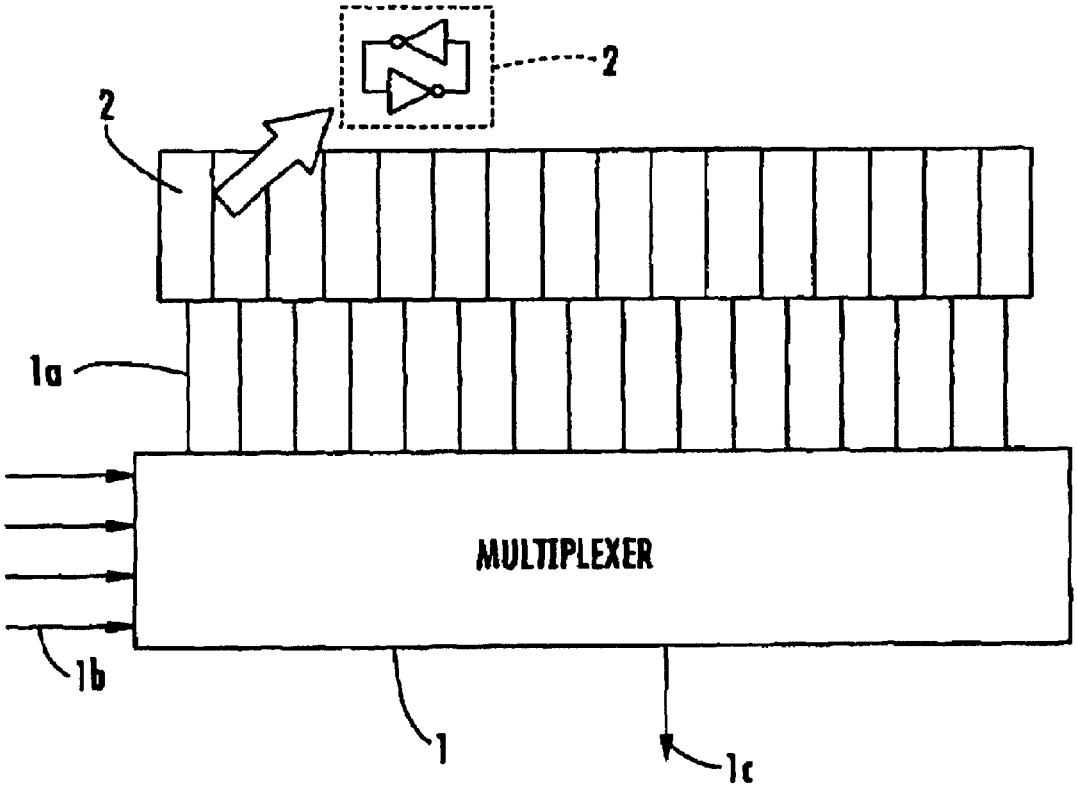
FIG. 1. (PRIOR ART)
FIG. 1 is a schematic block diagram illustrating a prior art look-up table with one decoder.

Programmable look-up tables (LUTs) are the main logic resources of the CPLD/FPGA and are typically spread across the device. As noted above with respect to FIG. 1, in prior art architectures the basic LUT structure is coupled to a single decoding multiplexer. The LUT illustratively shown in FIG. 1 is a four input type having sixteen SRAM latches. Any logic function having up to four inputs and one output can be implemented in this LUT. During circuit implementations in the CPLD/FPGA, a large portion of the combinatorial logic is absorbed by the LUTs. The LUTs are appropriately connected through the device routing resources to match the mapped Boolean network.

Figure 2:
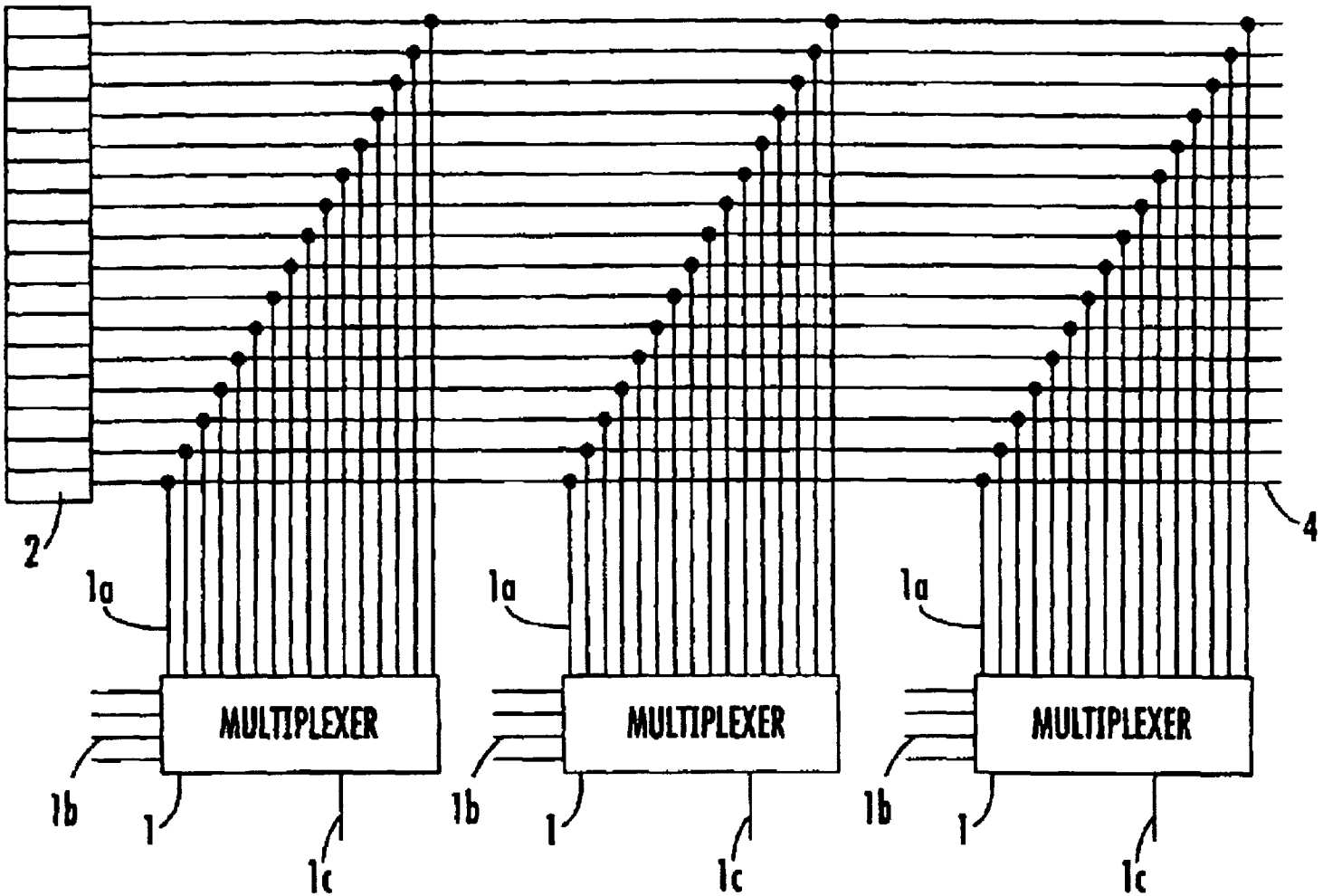
FIG. 2 is a schematic block diagram of a look-up table according to the invention having multiple decoders.

Referring now to FIG. 2, in accordance with the invention a single or common set of SRAM latches 2 are connected to three decoding multiplexers 1. The sixteen inputs 1a of the decoding multiplexers 1 are fed from the SRAM latches 2.

The four select lines 1b of each of the multiplexers are unique and unrelated. The same uniqueness holds true for multiplexer outputs 1c. It implies that these three multiplexers 1 can independently function as three, four-input look-up tables with identical configuration bits that are made available to the multiplexer inputs 1a via a latch data bus 4.

As will be appreciated by those skilled in the art, designs including repetitive LUT bit patterns can be readily accommodated in the latch-multiplexer arrangement illustrated in FIG. 2. Most common designs with these patterns are adders, subtractors, multipliers and counters. In a circuit netlist, a similarity in the terms of logical equivalence exists among the many Boolean functions mapped into LUTs. Two or more Boolean functions are said to be logically equivalent if they can be implemented in look-up tables with identical configuration bits. Considering a four-input, single-output look-up table of the preferred embodiment, examples of logical equivalent functions include:

1. ABC+D, AB+C, ABC, A+B, AB;
2. AB~+CD, AB~+C, A+BC, A~+BC, AB~, AB, A+B, A+B~; and
3. AB(C+D~), A(B+C~), ABC, ABC~, AB+C~, AB~+C, A+B, A+B~, AB, AB~.

It should be noted that the functions will have the same set of configuration bits. The four-variable function is the parent function, and the rest are its derivatives or children. The children have lesser numbers of variables. Thus, some of the LUT pins will remain unused or will have to be pulled up/down while implementing the children functions. It might also be possible that the children functions have the same number of variables as their parent functions. Such children and many more functions can be derived from the parent function if one or more inputs to the multiplexer select lines are connected through controlled inverters. Still more are possible if the multiplexer's output is also invertible.

Figure 3:
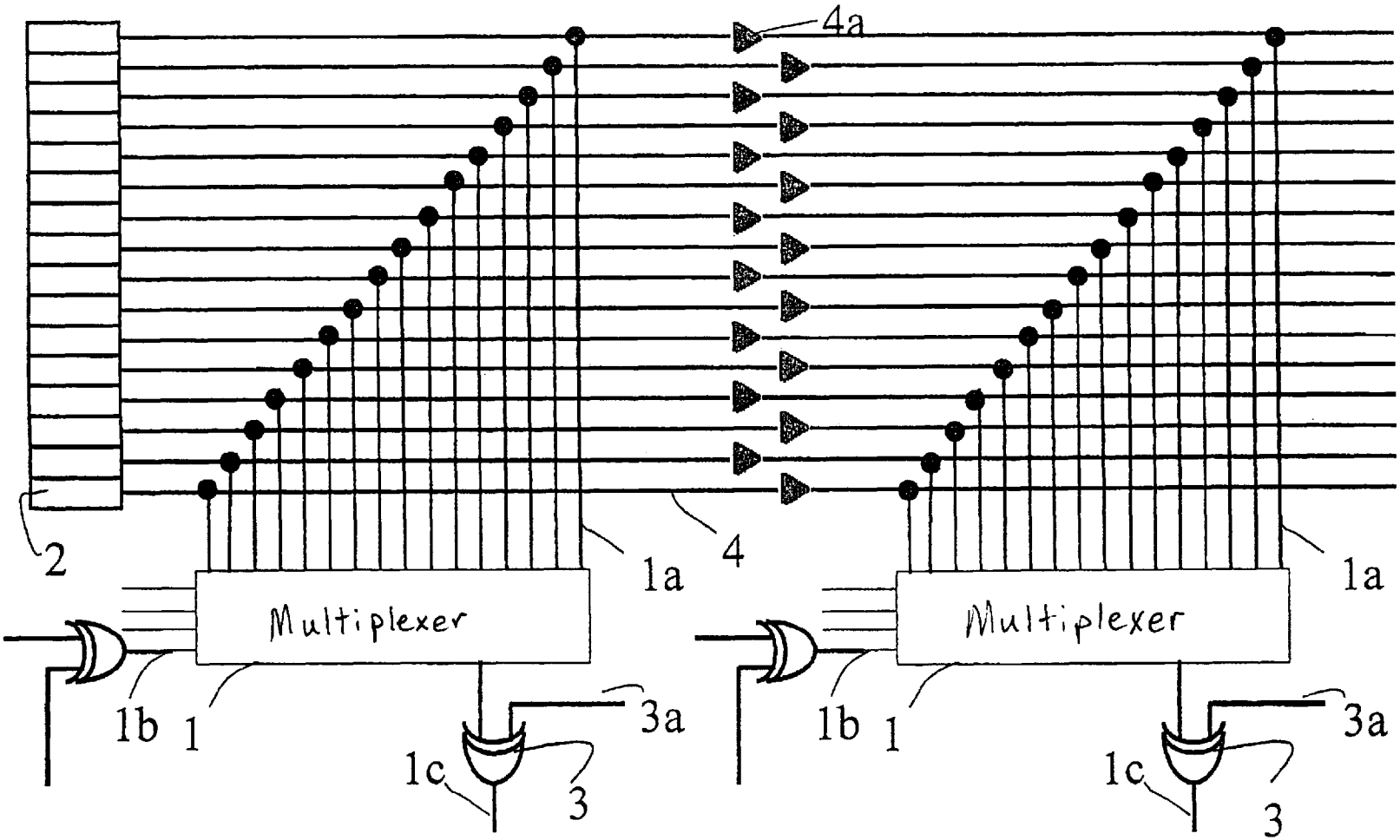
FIG. 3 is a schematic block diagram of an alternate embodiment of the look-up table according to invention having a controllable inverter or XOR gate at the output of the decoders.

Turning now to FIG. 3, a controlled inverter/XOR gate 3 is illustratively shown before the output of the decoding multiplexer to increase the number of derivative functions. The inverter control 3a may be either static or dynamic. If the sixteen latches of the preferred embodiment source several decoding multiplexers, buffers 4a may optionally be inserted at the latch outputs or in between the latch data bus 4 to communicate the latch data to distant multiplexers.

As will be appreciated by those skilled in the art, the lines conveying latch signals to the decoding multiplexers need not be optimized for delays if the CPLD/FPGA is not intended to be used as an extremely rapid reconfigurable device. Thus, in nearly all cases the latch data bus 4, which is sixteen bits wide here, may be minimum-width with minimum spacing and can follow any circuitous or meandering path to the decoding multiplexers. Therefore, routing the latches to the decoding multiplexers is not a critical design issue and may be given least priority while designing the device.

Figure 4:
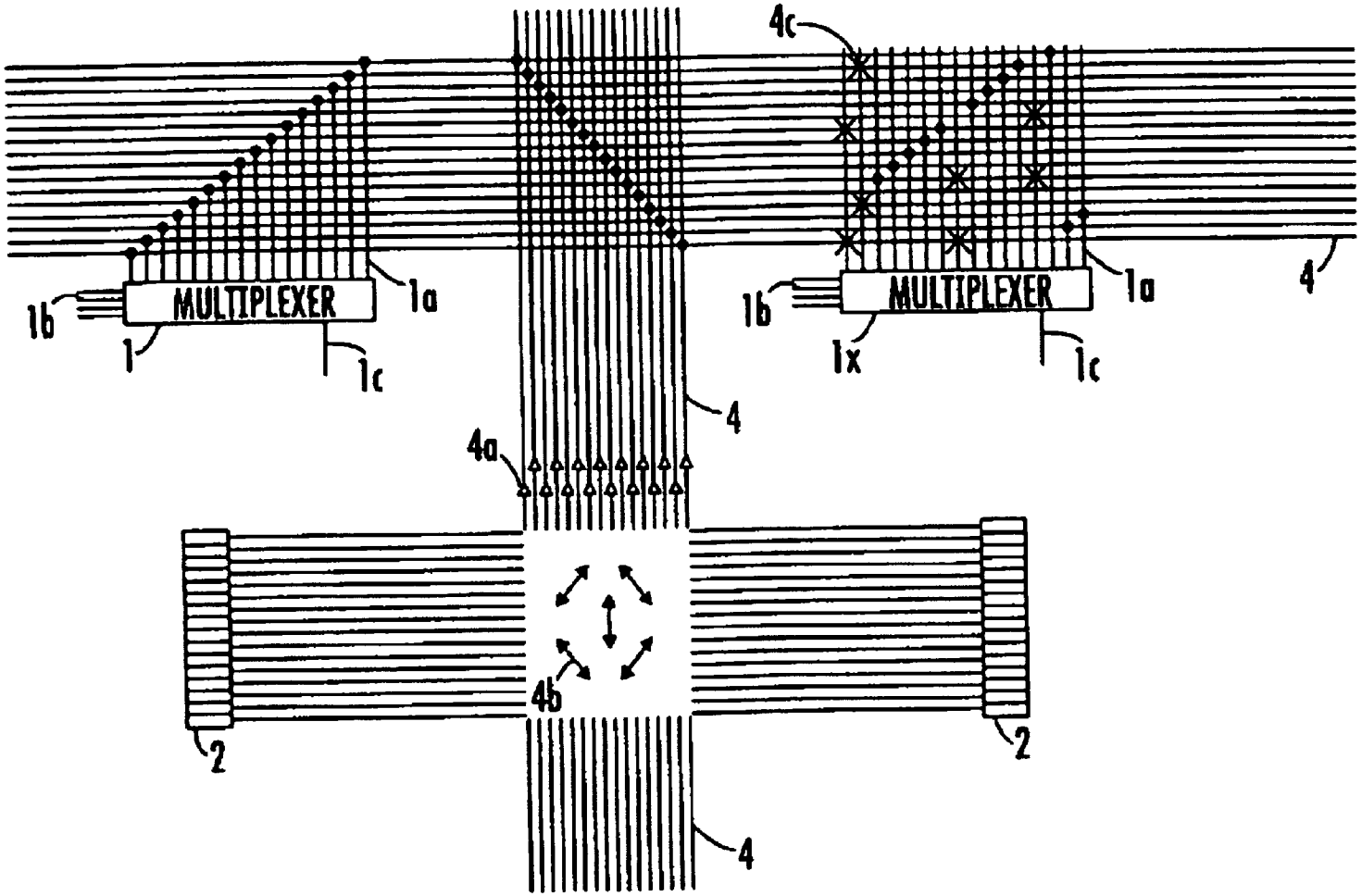
FIG. 4 is a schematic block diagram of another embodiment of the present invention using a programmable switch network.

Another alternate embodiment of the invention is illustrated in FIG. 4. Here, the latch data busses 4 extend across the device. Programmable switches 4b are inserted to distribute and route the latch data buses 4 originating from various LUT SRAM latches 2. These latch data buses may be routed to nearby or remote regions of the device using a programmable bus routing network 4. The routing network 4 in no way introduces any extra delays in the final circuit implementation, as static logic data resides on these latch data lines. Thus, the latch data buses 4 can traverse long distances and use any number of programmable switches 4b and 4c without affecting circuit performance. As all the nets in a bus are being routed at a time, configuration latch count is also low.

It is, of course, possible to alter the multiplexer connectivity to the latch data bus and even include flexibility at the decoding multiplexer inputs 1a (sixteen here). Inputs to the multiplexer 1x delineate such possibilities. To include more flexibility, programmable switches 4c are inserted to couple latch data bus 4 to the multiplexer inputs 1a as desired.

The present invention thus provides a look-up table with a plurality of read ports capable of performing functions that are identical or logically equivalent with other variants. The area saved by using this approach is appreciable and without significant delay overhead. In conclusion, the concept of sharing SRAM latches of LUTs reduces the number of SRAM latches and improves chip density.

While exemplary embodiments of the present invention have been described above, it is possible to use various alternatives, modifications and equivalents thereof. For example, a memory architecture other than SRAM may be used as the configuration host. These embodiments and others that will be apparent to those of skill in the art in light of the above disclosure are intended to fall within the scope of the present invention.

That which is claimed is:

1. A look-up table comprising:

a plurality of decoders each having a plurality of inputs and an output and each having a plurality of selection lines;

a plurality of common storage elements connected to the inputs of said decoders;

a plurality of buffers respectively connected between said common storage elements and at least one of said decoders for driving the inputs of said at least one decoder; and a programmable switch network selectively connecting said common storage elements to the inputs of said decoders;

said common storage elements being concurrently accessible by said decoders to simultaneously provide multiple outputs thereto.

2. The look-up table of claim 1 further comprising a controllable inverter connected to the output of at least one of said decoders.

3. The look-up table of claim 2 wherein said controllable inverter has a static control.

4. The look-up table of claim 2 wherein said controllable inverter has a dynamic control.

5. The look-up table of claim 1 further comprising an exclusive OR gate connected to the output of at least one of said decoders.

6. A look-up table comprising:

a plurality of common static random access memory (SRAM) storage elements;

a plurality of decoders each having a plurality of inputs and an output, and each having a plurality of selection lines;

a plurality of buffers respectively connected between said SRAM storage elements and at least one of said decoders for driving the inputs of said at least one decoder; and a programmable switch network selectively connecting said common SRAM storage elements to the inputs of said decoders;

said common storage elements being concurrently accessible by said decoders to simultaneously provide multiple outputs thereto.

7. The look-up table of claim 6 further comprising a controllable inverter connected to the output of at least one of said decoders.

8. The look-up table of claim 7 wherein said controllable inverter has a static control.

9. The look-up table of claim 7 wherein said controllable inverter has a dynamic control.

10. The look-up table of claim 6 further comprising an exclusive OR gate connected to the output of at least one of said decoders.

11. A method for reducing the number of programmable architecture elements in a lookup table required for implementing Boolean functions or other operations that are identical or logically equivalent, the look-up table comprising a plurality of decoders each having a plurality of inputs and an output, and each having a plurality of selection lines, the method comprising:

connecting a plurality of common storage elements to the inputs of said decoders using a programmable switch network;

connecting a buffer between each of the common storage elements and at least one of the decoders for driving the inputs of the at least one decoder; and using the decoders to concurrently accesses the common storage elements to simultaneously receive multiple outputs therefrom.

12. The method of claim 11 further comprising inverting the output of at least one of the decoders.

13. The method of claim 12 wherein inverting comprises performing statically controlled inversion.

14. The method of claim 12 wherein inverting comprises performing dynamically controlled inversion.

15. A method for performing logical operations comprising:

providing a look-up table comprising a plurality of decoders each having a plurality of inputs and an output, and each having a plurality of selection lines, a plurality of common storage elements connected to the inputs of the decoders, a plurality of buffers connected between the common storage elements and at least one of the decoders for driving the inputs of the at least one decoder, and a programmable switch network connected between the common storage elements and the inputs of the decoders;

selectively connecting the common storage elements to the inputs of the decoders using the programmable switch network; and using the decoders to concurrently access the common storage elements to simultaneously receive multiple outputs therefrom, the decoders thereby cooperating with the storage elements to perform the logical operations.

16. The method of claim 15 further comprising inverting the output of at least one of the decoders.

*17. Programmable logic device circuitry comprising:*

*a plurality of storage elements;*

*a plurality of decoders operably associated with the plurality of storage elements;*

*means for providing identical configuration bits to individual decoders; and*

*means for using the identical configuration bits to implement functions that are identical or logically equivalent.*

*18. The programmable logic device circuitry of claim 17, wherein the means for using comprises one or more controlled inverters operably connected to one or more of the plurality of decoders.*

*19. The programmable logic device circuitry of claim 18, wherein the one or more controlled inverters have static controls.*

*20. The programmable logic device circuitry of claim 18, wherein the one or more controlled inverters have dynamic controls.*

*21. The programmable logic device circuitry of claim 17, wherein the means for using comprises one or more controlled inverters operably connected to one or more select lines of one or more of the plurality of decoders.*

*22. The programmable logic device circuitry of claim 21, wherein the one or more controlled inverters have static controls.*

*23. The programmable logic device circuitry of claim 21, wherein the one or more controlled inverters have dynamic controls.*

*24. The programmable logic device circuitry of claim 17, wherein the means for using comprises one or more controlled inverters operably connected to an output of one or more of the plurality of decoders.*

*25. The programmable logic device circuitry of claim 24, wherein the one or more controlled inverters have static controls.*

*26. The programmable logic device circuitry of claim 24, wherein the one or more controlled inverters have dynamic controls.*

*27. The programmable logic device circuitry of claim 17, wherein the means for using comprises:*

*one or more controlled inverters operably connected to one or more select lines of one or more of the plurality of decoders; and*

*one or more other controlled inverters operably connected to an output of one or more of the plurality of decoders.*

*28. The programmable logic device circuitry of claim 27, wherein at least some of the controlled inverters have static controls.*

*29. The programmable logic device circuitry of claim 27, wherein at least some of the controlled inverters have dynamic controls.*

*30. The programmable logic device circuitry of claim 17, wherein the functions comprise at least 4-variable functions.*

*31. The programmable logic device circuitry of claim 30, wherein 4-variable functions comprise parent functions, and wherein at least some children functions of the parent functions have lesser numbers of variables.*

*32. Programmable logic device circuitry comprising:*

*a plurality of storage elements;*

*a plurality of decoders operably associated with the plurality of storage elements;*

*first circuitry configured to provide identical configuration bits to individual decoders; and*

*second circuitry configured to use the identical configuration bits to implement Boolean functions that are identical or logically equivalent.*

*33. The programmable logic device circuitry of claim 32, wherein the second circuitry comprises one or more controlled inverters operably connected to one or more of the plurality of decoders.*

*34. The programmable logic device circuitry of claim 32, wherein the second circuitry comprises one or more controlled inverters operably connected to one or more select lines of one or more of the plurality of decoders.*

*35. The programmable logic device circuitry of claim 32, wherein the second circuitry comprises one or more controlled inverters operably connected to an output of one or more of the plurality of decoders.*

*36. The programmable logic device circuitry of claim 32, wherein the second circuitry comprises:*

*one or more controlled inverters operably connected to one or more select lines of one or more of the plurality of decoders; and*

*one or more other controlled inverters operably connected to an output of one or more of the plurality of decoders.*

*37. The programmable logic device circuitry of claim 32, wherein the functions comprise at least 4-variable functions.*

*38. The programmable logic device circuitry of claim 37, wherein 4-variable functions comprise parent functions, and wherein at least some children functions of the parent functions have lesser numbers of variables.*

*39. A method comprising:*

*accessing, using multiple decoders in a programmable logic device, common storage elements to receive multiple outputs from the common storage elements; and*

*operating the multiple decoders, using the multiple outputs, to implement functions or other operations that are identical or logically equivalent.*

*40. The method of claim 39, wherein said operating comprises inverting one or more inputs to one or more of the multiple decoders.*

*41. The method of claim 39, wherein said operating comprises inverting one or more outputs of one or more of the multiple decoders.*

*42. The method of claim 39, wherein said operating comprises:*

*inverting one or more inputs to one or more of the multiple decoders; and*

*inverting one or more outputs of the one or more multiple decoders.*

*43. The method of claim 39, wherein said functions comprise Boolean functions.*

*44. The method of claim 39, wherein said common storage elements comprise SRAM latches.*

*45. The method of claim 39, wherein said functions comprise at least 4-variable functions.*

*46. The method of claim 45, wherein 4-variable functions comprise parent functions, and wherein at least some children functions of the parent functions have lesser numbers of variables.*

*47. A method comprising:*

*buffering inputs to at least one decoder of a collection of decoders in a programmable logic device, said inputs being received from common storage elements; and*

*concurrently accessing, with the collection of decoders, the common storage elements effective to implement functions or other operations that are identical or logically equivalent.*

*48. The method of claim 47 further comprising inverting at least one select line to at least one of the decoders.*

*49. The method of claim 47 further comprising inverting at least one output of at least one of the decoders.*

*50. The method of claim 47 further comprising:*

*inverting at least one select line to at least one of the decoders; and*

*inverting at least one output of at least one of the decoders.*

*51. The method of claim 47, wherein said functions comprise Boolean functions.*

*52. The method of claim 47, wherein said common storage elements comprises SRAM latches.*

*53. The method of claim 47, wherein the functions comprise at least 4-variable functions.*

*54. The method of claim 53, wherein 4-variable functions comprise parent functions, and wherein at least some children functions of the parent functions have lesser numbers of variables.*

* * * * *

UNITED STATES PATENT AND TRADEMARK OFFICE

CERTIFICATE OF CORRECTION

PATENT NO. : RE 41,561 E
APPLICATION NO. : 12/110205
DATED : August 24, 2010
INVENTOR(S) : Ankur Bal It is certified that error appears in the above-identified patent and that said Letters Patent is hereby corrected as shown below:

In column 5, line 8, in claim 11, delete "lookup" and insert -- look-up --, therefor.

In column 8, line 27, in claim 52, delete "comprises" and insert -- comprise --, therefor.

Signed and Sealed this

Thirtieth Day of November, 2010

David J. Kappos

David J. Kappos
*Director of the United States Patent and Trademark Office*